United States Patent
Li et al.

(10) Patent No.: US 10,436,848 B2
(45) Date of Patent: Oct. 8, 2019

(54) BATTERY CAPACITY ACTIVE ESTIMATION METHOD USED FOR ELECTRIC VEHICLE

(71) Applicants: Bordrin Motor Corporation, Inc., Southfield, MI (US); Nanjing Shenghe New Energy Technology Co., Ltd., Nanjing OT (CN); Huai'an Junsheng New Energy Technology Co., Ltd., Huai'an OT (CN)

(72) Inventors: Yonghua Li, Ann Arbor, MI (US); Yang Zhang, Shanghai (CN); Tiepeng Zhao, Shanghai (CN); Zhiwei Zhang, Shanghai (CN)

(73) Assignees: Bordrin Motor Corporation, Inc., Southfield, MI (US); Nanjing Shenghe New Energy Technology Co., Ltd., Nanjing (CN); Huai'an Junsheng New Energy Technology Co., Ltd., Huai'an (CN)

( * ) Notice: Subject to any disclaimer, the term of this patent is extended or adjusted under 35 U.S.C. 154(b) by 0 days.

(21) Appl. No.: 15/686,820

(22) Filed: Aug. 25, 2017

(65) Prior Publication Data
US 2018/0340983 A1 Nov. 29, 2018

(30) Foreign Application Priority Data
May 25, 2017 (CN) .......................... 2017 1 0378619

(51) Int. Cl.
*G01R 31/367* (2019.01)
*G01R 31/3828* (2019.01)
(Continued)

(52) U.S. Cl.
CPC ....... *G01R 31/367* (2019.01); *G01R 31/3828* (2019.01); *G01R 31/3842* (2019.01); *B60Y 2200/91* (2013.01); *G01R 31/374* (2019.01)

(58) Field of Classification Search
CPC .............. G01R 31/361; G01R 31/3624; B60L 11/1861; B60L 11/1851; B60L 11/1864
See application file for complete search history.

(56) References Cited

U.S. PATENT DOCUMENTS 8,004,243 B2 * 8/2011 Paryani .............. G01R 31/3624
320/132
8,751,086 B2 6/2014 Li et al.
(Continued)

OTHER PUBLICATIONS

Onor et al., "A new life estimation method for lithium-ion batteries in plug-in hybrid electric vehicles applications", 2012, Int. J. Power Electronics, vol. 4. No. 3, pp. 302-319.*
(Continued)

*Primary Examiner* — Mischita L Henson
(74) *Attorney, Agent, or Firm* — Brinks Gilson & Lione

(57) ABSTRACT

The present disclosure relates to a battery capacity active estimation method for an electric vehicle. The method is capable of determining the battery capacity based on estimating a State Of Charge (SOC) of the battery before and after a discharge operation but without having to wait until an establishment of sufficient thermal and electric equilibria in the battery. The estimation of SOC may even be made while the battery is being slowly charged. Depending on the equilibrium state of the battery, SOCs may be either directly obtained by measuring Open Circuit Voltage of the battery when the battery is in electric equilibrium or calculated and estimated when the battery is not in electric equilibrium.

12 Claims, 2 Drawing Sheets

(51) Int. Cl.
*G01R 31/3842* (2019.01)
*G01R 31/374* (2019.01)

(56) References Cited

U.S. PATENT DOCUMENTS

| | | | |
|---|---|---|---|
| 9,539,912 B2 | 1/2017 | Li | |
| 2006/0261782 A1* | 11/2006 | Kim | H01M 10/44 320/132 |
| 2008/0074082 A1* | 3/2008 | Tae | B60L 11/1862 320/136 |
| 2012/0133369 A1* | 5/2012 | Johnson | G01R 31/3648 324/427 |
| 2013/0134787 A1* | 5/2013 | Sakakibara | H02J 7/0068 307/72 |
| 2013/0138369 A1* | 5/2013 | Papana | G01R 31/3644 702/63 |
| 2013/0300377 A1* | 11/2013 | Mao | B60L 11/14 320/152 |
| 2014/0236511 A1* | 8/2014 | Kulkarni | G01R 31/362 702/63 |
| 2014/0265554 A1* | 9/2014 | Yang | B60L 11/1868 307/9.1 |
| 2015/0158395 A1 | 6/2015 | Li et al. | |

OTHER PUBLICATIONS

Xidong Tang et al., Capacity Estimation for Li-ion Batteries, 2011, Jun. 29-Jul. 1, 2011 American Control Conference, pp. 947-952 (Year: 2011).*

* cited by examiner

BATTERY CAPACITY ACTIVE ESTIMATION METHOD USED FOR ELECTRIC VEHICLE

BACKGROUND

Priority Claim

This application claims the benefit of priority from Chinese Patent Application No. 201710378619.X filed May 25, 2017, which is incorporated by reference.

Technical Field

The present invention relates to the field of battery management, and in particular, to a battery capacity active estimation method applicable to a purely electric vehicle.

RELATED ART

In an electric vehicle, there are numerous high-voltage electrical components, such as a high-voltage battery pack, a high-voltage distribution box, a motor controller, an air-conditioner controller, a DC/DC converter, and a battery charger. A power battery, alternatively referred to as a battery, is one of the most important components. Performance of the battery usually degrades as an extent of usage, a usage time, or a storage time accumulates. Degradation of the battery performance usually manifests in two forms: a decrease of battery capacity, and a reduction of charging and discharging power capabilities under a state of charge (SOC, or the electric charge level relative to full charge storage capacity) and a same temperature. In the industry, for example, usually a loss of over 20% of a battery capacity indicates that a battery does not have an adequate capacity any longer.

If a change of battery capacity over the course of the use of the battery cannot be effectively and accurately estimated, accuracy of battery SOC (state of charge) calculation would be adversely affected, and accuracy of SOP (state of power) calculation is also affected. Inaccurate SOC and SOP lead to inaccurate prediction of the state of the battery and consequently lead to inappropriate usage of a battery and shortening of a battery lifespan, and, in extreme cases, may affect driving and charging safety.

In the industry, there are two existing methods for determining a lithium battery capacity. The first method is to use the battery capacity as a variable, and learn the battery capacity together with the SOC and other model parameters. A disadvantage of this method is that observability of the battery capacity is very low. e.g., battery capacity cannot be easily estimated through a limited number of measurements of battery current, voltage and temperature in the same drive cycle. In other words, compared with other battery model parameters such as the Ohmic resistance in many equivalent battery circuit model, battery capacity is almost invariant in a specified charging/discharging cycle, and there is no proven method with acceptable accuracy to learn the battery capacity together with other rapidly changing parameters at the same time. The second method is to use, by means of a definition of the SOC, to directly derive two SOCs independent of capacity from measuring OCV (Open Circuit Voltage) when the battery is offline for a sufficiently long time and thus in thermal and electric equilibria, obtain a capacity value from the directly derived SOCs and recorded charge/discharge activities of the battery, and perform appropriate processing (filtering) to obtain a final capacity value.

There are already some algorithms implemented by using the second method. For example, in U.S. Pat. No. 8,751,086, a battery capacity calculation of a plug-in hybrid electric vehicle is implemented by performing accurate estimation (by means of OCVs) on two SOCs and considering a current, a temperature, and a total integrated current into the algorithm. Accordingly, a relatively harsh requirement (e.g., charge and electric equilibrium in the battery) is imposed on obtaining accurate OCV values, and such requirement needs time to be established during the use of the battery. As such, the battery capacity may not be capable of being learned in a timely manner. Further, even if two accurately measurable OCVs are successfully taken, if any of these OCVs is obtained after the battery is offline much longer than a sufficiently long time, then the existence of battery internal leakage current may render the above capacity estimation method rather inaccurate.

The currently existing capacity calculation and estimation algorithms that are based on the second method do not take into consideration that a purely electric vehicle (herein simply referred to as electric vehicle, as opposed to a hybrid electric vehicle) has a special feature: the battery always needs to be charged after being used for a period of time, and at times, between vehicle operations. As such, the battery may not be in the required equilibrium most of the time. Therefore, by means of the existing calculation method, either the measured OCVs are inaccurate (if measured between short time span after the battery goes offline due to the fact that the battery is in a non-equilibrium state), or the estimation of charge capacity from the OCVs may be inaccurate (because even if the OCVs are accurately measured between a long time span longer than a sufficiently long time, and when the battery is in equilibrium, the battery internal leakage current cannot be effectively estimated and taken into consideration). Therefore, it is desirable to identify an approach to learn a battery capacity in a non-ideal situation by estimating SOCs under thermal and electric non-equilibria.

SUMMARY

An objective of the present disclosure is to provide, for the foregoing problems, a battery capacity active estimation method used for an electric vehicle.

The objective of the present disclosure may be implemented by using the following technical solutions.

A battery capacity active estimation method used for a battery electric vehicle is used for performing periodic active estimation on a battery capacity of the battery electric vehicle. The method includes the following steps:
1) determining whether a battery capacity periodic estimation time of the battery electric vehicle is reached, and if the battery capacity periodic estimation time of the battery electric vehicle is reached, going to step 2); or if the battery capacity periodic estimation time of the battery electric vehicle is not reached, returning to step 1);
2) determining whether a first SOC value of a battery can be accurately obtained, and if the first SOC value of the battery can be accurately obtained, obtaining the first SOC value by reading a first OCV value and a current temperature, and going to step 3); or if the first SOC value of the battery cannot be accurately obtained, abandoning estimation;
3) calculating a total current integral value of the battery electric vehicle in an operating state;
4) determining, according to a battery offline time of the battery electric vehicle, whether a second SOC value can be estimated, and if the second SOC value can be estimated, estimating the second SOC value and going to step 5); or if the second SOC value cannot be estimated, abandoning estimation; and 5) calculating according to the first SOC value obtained in step 2), the total current integral value obtained in step 3), and the second SOC value obtained in step 4) to obtain a battery capacity estimation value of the battery electric vehicle.

Step 4) is specifically:

41) determining whether the battery offline time of the battery electric vehicle reaches a first threshold, and if the battery offline time of the battery electric vehicle reaches the first threshold, directly reading a port voltage of the battery and obtaining a second SOC value by combining the port voltage and a battery cell temperature through the SOC-OCV lookup table; or if the battery offline time of the battery electric vehicle does not reach the first threshold, going to step 42);

42) determining whether the battery offline time of the battery electric vehicle reaches a second threshold, and if the battery offline time of the battery electric vehicle reaches the second threshold, obtaining the second SOC value by performing estimation calculation; or if the battery offline time of the battery electric vehicle does not reach the second threshold, going into step 43);

43) determining whether the battery electric vehicle enters a non-offline state by means of being waken up by a slowing charging event detected from a signal from a charging pin of the battery charger, and if the battery electric vehicle enters a non-offline state by means of being wakeup-up by a slow charging event, going to step 44); or if the battery electric vehicle does not enter a non-offline state by means of being waken-up by a slow charging event, abandoning estimation; and 44) when a slow charging time reaches the first threshold, calculating by means of low current charging to obtain the second SOC value.

The obtaining the second SOC value by performing estimation calculation is specifically:

421) reading a battery offline time, a battery initial voltage, and a battery subsequent voltage;

422) obtaining, according to results read in step 421), relational expressions of a second OCV value of the battery and the battery initial voltage, the second OCV value and the battery subsequent voltage, and the second OCV value and the battery offline time;

423) solving the relational expressions in step 422) by using a least square method, to obtain the second OCV value of the battery; and 424) obtaining the second SOC value of the battery according to the second OCV value of the battery and a current battery temperature.

The obtaining the second SOC value by performing estimation calculation further includes: repeating steps 421) to step 423), to obtain a series of second OCV values of the battery that is not less than that required by a user, calculating an average value of the second OCV values of in the given series of SOCs, using the average value as a final result, and going to step 424).

The calculating by means of low current charging to obtain the second SOC value is specifically:

441) reading a current battery voltage and a current battery temperature;

442) obtaining, according to the current battery voltage and the current battery temperature, a third OCV value of the battery;

443) obtaining, according to a relation curve of SOC-OCV, a third SOC value corresponding to the third OCV value; and 444) calculating according to the third OCV value obtained in step 443) and by combining a current value of slow charging, to obtain the second SOC value, which is specifically:

$$SOC_2 = SOC_3 - \frac{I_{small} \times T_{cal1} \times \eta}{Q_{old}},$$

where $SOC_2$ is the second SOC value, is $SOC_3$ is the third SOC value, $I_{small}$ is the current value of slow charging, which is a positive value in this usage, $T_{cal1}$ is a slow charging time, $\eta$ is battery charging efficiency, and $Q_{old}$ is a historical estimation result.

The third OCV value according to step 442) above, can be further modified if direct current resistance of the battery can be obtained at the present battery temperature. That is, $OCV_3 = V_3 - I_{small} * (r_0 + r_1 + r_2)$ where $V_3$ is the battery voltage as measured in 441), $I_{small}$ is the charge current (a positive value indicating current flowing into the battery), and $r_0$, $r_1$ and $r_2$ are resistances of the equivalent battery model at present battery temperature, as shown in FIG. 2.

The total current integral value is specifically:

$$CurrInt = \int_0^{Tend} I(\tau) \cdot \eta d\tau,$$

where

CurrInt is the total current integral value, $\eta$ is the battery charging efficiency, and Tend is an operating time of the battery electric vehicle.

Step 5) is specifically:

51) calculating according to the first SOC value obtained in step 2), the total current integral value obtained in step 3), and the second SOC value obtained in step 4) to obtain a current estimation capacity $Q_{learned}$;

52) calculating, according to an estimation time of the battery, a current capacity filtering coefficient $Alpha_{new}$; and 53) calculating, according to the current estimation capacity $Q_{learned}$ obtained in step 51) and the current capacity filtering coefficient $Alpha_{new}$ obtained in step 52), to obtain a battery capacity estimation value of the battery electric vehicle.

The current estimation capacity $Q_{learned}$ is specifically:

$$Q_{learned} = \frac{CurrInt}{SOC_1 - SOC_2},$$

where

CurrInt is the total current integral value, $SOC_1$ is the first SOC value, and $SOC_2$ is the second SOC value.

The capacity filtering coefficient $Alpha_{new}$ is specifically:

$$Alpha_{new} = Alpha \times \frac{\sqrt{T+T_1}}{\sqrt{T+T_c}},$$

where

Alpha is a calibrated filtering coefficient, T is a battery actual lifespan clock, $T_1$ is a calibrated estimation time, and $T_c$ is an actual estimation time.

The battery capacity estimation value of the battery electric vehicle is specifically:

$$Q=Q_{old}\times Alpha_{new}+(1-Alpha_{new})\times Q_{learned}, \text{ where}$$

$Q_{old}$ is the historical estimation result.

Compared with the prior art, the present implementations has the following benefits:

(1) In a process of obtaining a first SOC value and a second SOC value, length of offline time and charging of a battery is fully considered, so as to avoid effects of battery internal electricity leakage. Therefore, the obtained results of the first SOC value and the second SOC value are more accurate, thereby improving accuracy of the final capacity estimation.

(2) In a process of estimating the second SOC value, the offline time of the battery is first considered. For a battery with a sufficiently long offline time, the second SOC value is directly obtained by reading a port voltage, avoiding a complex estimation process. For a battery that has an offline time satisfying a requirement or an offline time not satisfying the requirement but is slowly charged, the second SOC value is obtained by performing estimation calculation or calculation by means of low current charging. The second SOC value of the battery is estimated whenever possible so as to achieve capacity estimation even when direct measurement of SOC from the OCV may not be accurate. Learning of the battery capacity is abandoned only for a battery that has an offline time not satisfying the requirement and a vehicle waken-up manner not being a low current charging. As such, the estimation process may be carried out even when the battery is not completely in equilibrium, thereby reducing a barrier to battery capacity estimation, and enabling timely and more frequent capacity estimation;

(3) For a battery being charged slowly, the second SOC value is still obtained by means of estimation and calculation above. The estimation and calculation is applicable not only under a common condition where the electric vehicle is charged via an external charging station, but also under a condition where the vehicle is slowly charged using a household charging station. The method for estimating the second SOC may thus be applied in a wide range of conditions.

(4) A second OCV value of the battery in some implementations is calculated by using a least square method. The calculated second OCV may then be used to obtain the second SOC value of the battery. This calculation method is more accurate, and improves final capacity estimation accuracy.

(5) In a process of calculating the second SOC value, the second OCV value may be calculated multiple times to obtain an average value as a basis for determining the second SOC value, thereby further improving capacity estimation accuracy.

(6) In a capacity estimation process, a capacity filtering coefficient is introduced. The capacity filtering coefficient is calculated according to an actual estimation time of the battery. Therefore, capacity estimation is matched to an estimation interval time, thereby satisfying an actual situation and obtaining high accuracy.

(7) In the estimation method, an SOC value of the battery is obtained by reading an OCV value. Therefore, the method can track a capacity change of each battery cell in the battery, and is thus highly practical.

DETAILED DESCRIPTION

The following describes the present invention in detail with reference to the accompany drawings and embodiments. The embodiments are implemented by using the technical solutions of the present disclosure. Detailed implementation manners and specific operation processes are provided, but the protection scope of the present invention is not limited to the following embodiments.

Figure 1:
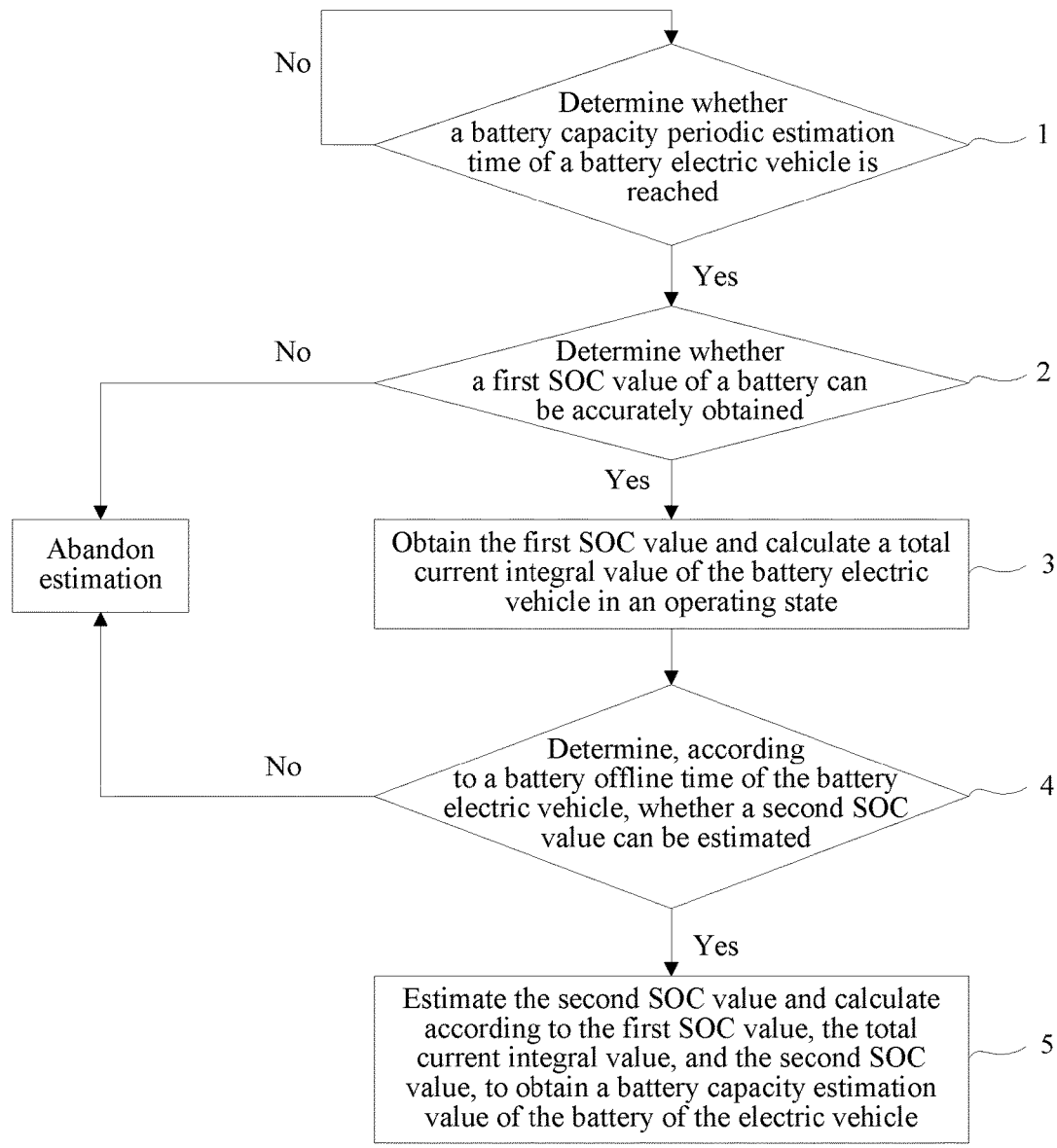
FIG. 1 is a flowchart of a method according to the present disclosure.

FIG. 1 shows a logic flow of a battery capacity active estimation method used for an electric vehicle according to the present disclosure. The method is used for performing periodic active estimation of the battery capacity of the electric vehicle. The method includes the following steps 1) to 5). Some of these steps may include substeps. For example, step 4) may include substeps 41) to 44). A substep may further include sub-substeps. For example, substep 42) may include sub-substeps 421) to 424).

1) determining whether a battery capacity periodic estimation time of the battery of the electric vehicle is reached, and if the battery capacity periodic estimation time of the battery of the electric vehicle is reached, the method proceeds to step 2); or if the battery capacity periodic estimation time of the battery of the electric vehicle is not reached, the method returns to and repeat step 1);

2) determining whether a first SOC value of the battery can be accurately obtained, and if the first SOC value of the battery can be accurately obtained, obtaining the first SOC value and proceeding to step 3); or if the first SOC value of the battery cannot be accurately obtained, abandoning estimation;

3) calculating a total integrated current of the battery of the electric vehicle in an operating state since the determination of the first SOC;

$$CurrInt = \int_{0}^{Tend} I(\tau) \cdot \eta d\tau,$$

where

Figure 2:
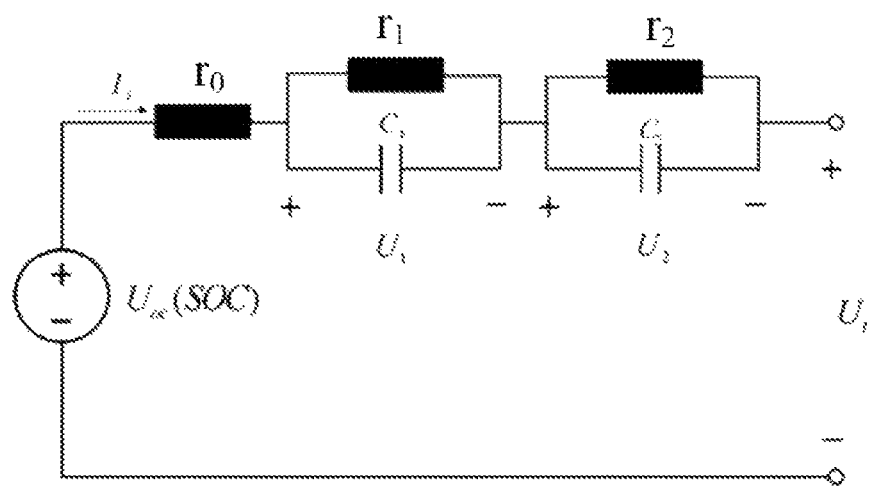
FIG. 2 is an effective circuit diagram for a battery (or a battery cell).

CurrInt is the total integrated current, $\eta$ is battery charging and discharging efficiency, and Tend is an operating time of the electric vehicle;

the battery charging and discharging efficiency $\eta$ is marked as 1 when the battery is being discharged, and is a function of a battery temperature when the battery is being charged (when charging, not all charges released by the current source are stored in the battery and charging in addition to discharging occurs during operating state, when, e.g., the vehicle is braking); and 4) determining, according to a battery offline time of the battery of the electric vehicle since the end of the operation of the electric vehicle in step 3), whether a second SOC value can be estimated, and if the second SOC value can be estimated, estimating the second SOC value and proceeding to step 5); or if the second SOC value cannot be estimated, abandoning estimation. Step 4) may include the following substeps:

41) determining whether the battery offline time of the battery of the electric vehicle since the end of the operation of the electric vehicle in step 3) reaches a first threshold, and if the battery offline time of the battery of the electric vehicle reaches the first threshold, directly reading a port voltage of the battery and a battery cell temperature, and obtaining a second SOC value based on the port voltage and a battery cell temperature; or if the battery offline time of the battery of the electric vehicle does not reach the first threshold, proceeding to step 42);

42) determining whether the battery offline time of the battery of the electric vehicle since the end of the operation of the electric vehicle in step 3) reaches a second threshold, and if the battery offline time of the battery of the electric vehicle reaches the second threshold, obtaining the second SOC value by performing estimation calculation; or if the battery offline time of the battery of the electric vehicle does not reach the second threshold, proceeding into step 43). In the implementation of step 42), obtaining the second SOC value by performing estimation calculation includes specifically 421) to 424):

421) reading a battery offline time, a battery initial voltage, and subsequent voltages of the battery;

422) obtaining, according to results read in step 421), relational expressions between a second OCV value of the battery, the battery initial voltage, the subsequent voltages of the battery, and the battery offline time, based on a model electric circuit for the battery (such as FIG. 2);

423) solving the relational expressions in step 422) by using a least square method, to obtain the second OCV value of the battery; and obtaining the second OCV value by performing estimation calculation above may further include: repeating steps 421) to step 423), to obtain a number of second OCV values of the battery that is not less than a number required by a user, calculating an average value of the number of second OCV values of the battery, using the average value as a final result for the second OCV, and proceeding to step 424);

424) obtaining the second SOC value of the battery according to the second OCV value of the battery and a current battery temperature (e.g., based on a OCV-SOC curve at the current battery temperature).

43) when the battery offline time of the battery of the electric vehicle since the end of operation of the electric vehicle in step 3) does not reach the second threshold, determining whether the electric vehicle enters a non-offline state by means of a slow charging event detected from a signal from a charging pin of the battery charger, and if the electric vehicle enters a non-offline state by means of a slow charging event, proceeding to step 44); or if the electric vehicle does not enter a non-offline state by means of a slow charging event, abandoning estimation; and 44) when a slow charging time reaches the first threshold, calculating by means of low current charging to obtain the second SOC value:

441) reading a current battery voltage and a current battery temperature;

442) obtaining, according to the current battery voltage and the current battery temperature, a third OCV value of the battery;

The third OCV value according to step 442) above, can be further modified if direct current resistance of the battery can be obtained at the present battery temperature. That is, $$OCV_3 = V_3 - I_{small} * (r_0 + r_1 + r_2)$$

where $V_3$ is the battery voltage as measured in 441), $I_{small}$ is the charge current plowing into the battery, and $r_0$, $r_1$ and $r_2$ are resistances of the equivalent battery model at present battery temperature, as shown in FIG. 2.

443) obtaining, according to a relation curve of SOC-OCV, a third SOC value corresponding to the third OCV value; and 444) calculating according to the third SOC value obtained in step 443) and by combining a current value of slow charging, to obtain the second SOC value, which is specifically:

$$SOC_2 = SOC_3 - \frac{I_{small} \times T_{cal1} \times \eta}{Q_{old}},$$

where $SOC_2$ is the second SOC value, $SOC_3$ is the third SOC value, $I_{small}$ is the current value of slow charging, $T_{cal1}$ is a slow charging time, $\eta$ is battery charging and discharging efficiency, and $Q_{old}$ is a historical estimation result for the battery capacity (the previous estimation of charge capacity);

1) calculating according to the first SOC value obtained in step 2), the total integrated current obtained in step 3), and the second SOC value obtained in step 4) to obtain a battery capacity estimation value of the battery of the electric vehicle:

51) calculating according to the first SOC value obtained in step 2), the total current integral value obtained in step 3), and the second SOC value obtained in step 4) to obtain a current estimation capacity $Q_{learned}$;

$$Q_{learned} = \frac{CurrInt}{SOC_1 - SOC_2},$$

where

CurrInt is the total current integral value, $SOC_1$ is the first SOC value, and $SOC_2$ is the second SOC value;

52) calculating, according to an estimation time of the battery, a current capacity filtering coefficient $Alpha_{new}$:

$$Alpha_{new} = Alpha \times \frac{\sqrt{T + T_1}}{\sqrt{T + T_c}},$$

where

Alpha is a calibrated filtering coefficient predefined via e.g., empirical approaches, T is a battery actual lifespan clock (at the previous scheduled capacity estimation time), $T_1$ is a calibrated estimation time (scheduled estimation time for the current capacity estimate), and $T_c$ is an actual estimation time for the current capacity estimate;

53) calculating, according to the current estimation capacity $Q_{learned}$ obtained in step 51) and the current capacity filtering coefficient $Alpha_{new}$ in step 52), to obtain a battery capacity estimation value of the battery electric vehicle:

$$Q = Q_{old} \times Alpha_{new} + (1 - Alpha_{new}) \times Q_{learned}, \text{ where}$$

$Q_{old}$ is the historical capacity estimation result.

The steps above may be performed for each individual cell of the battery.

The steps above may be further described considering that the battery is represented by a second-order model circuit, as shown in FIG. 2. All model parameters r0, r1, C1, r2, and C2 are known battery parameters as functions of the battery temperature. The battery SOC is a nonlinear monotonic increasing function of an open-circuit voltage when the battery is in equilibrium state for each battery temperature. Such a function is represented by the characteristic OCV-SOC curves for the battery at various temperatures. The estimation process for the battery capacity is as follows:

A: Determining, according to a calendar, whether to learn the battery capacity

When other factors are equivalent, a lithium battery capacity changes according to an inverse square root time relationship, that is, when the lithium battery is used for a long time, a corresponding capacity is obtained by dividing an initial capacity by a square root of time.

According to the foregoing features, when BMS (Battery Management System) software is designed, a minimum capacity learning time period is first determined. Times for estimating capacity is accordingly scheduled. A BMS global clock determines whether a capacity value needs to be learned.

In the method, the calendar time determines when to learn the capacity and learn a filtering coefficient. As an alternative method, the calendar time may be substituted by a discharge capacity. The only thing that needs to be modified accordingly is that a root of the discharge capacity does not need to be taken any more during filtering coefficient calculation (substep 52)).

B: Determining a first SOC value

Once the global clock triggers capacity learning, the first step is to read an OCV value of each battery cell according to a power-off time of a battery pack at Key-on. These OCV values determine a first SOC value of each battery cell. If the power-off time of the battery pack is excessively short and these first SOC values cannot be obtained, capacity learning of this round is abandoned; that is, if the first SOC cannot be reliably obtained, wait for a next round for capacity learning and abandon the learning of this current round.

C: Determining an integrated current (alternatively referred to as current integral)

When a vehicle runs, a total current is integrated, considering both discharging and charging and their efficiency. The integrated current is used for capacity calculation (steps 3) and 5) above).

D: Waiting for KeyOn or charging triggering after KeyOff from the vehicle Operation of C Above A feature of a purely electric vehicle is that charging of the battery is necessary. Therefore, once Keyoff occurs, an offline time of the battery pack may be detected at any time.

Once detecting KeyOn/charging, it is determined whether the offline time since the end of the vehicle operation of C above is enough for determining a second SOC (whether the battery is in equilibrium right before the Keyon/charging); If so, then go to step G (G-1 in particular). If the offline time is not enough for determining the second SOC value, estimation for the second SOC may depend on the waking up manner (KeyOn or charging). If it is KeyOn, it is then determined whether the offline time is sufficiently long for estimating a final SOC value, and obtain the second SOC (G-2 below). If the offline time is not enough for estimating the final SOC value, abandon capacity learning in this cycle, eliminate related variables, and wait for a next cycle of learning; that is, go to step F. If the waking up manner is charging, it is then determined whether the offline time is enough for estimating a final SOC value, and obtain a required second SOC; that is, go to step E. If the offline time is not enough for estimating the final SOC value, and slow charging is performed, select a method of charging by using a low current so as to achieve an objective of obtaining the second SOC value (G-4 below).

E: Different charging manners—a household charging station and slow charging

If a household charging station is used for charging, perform constant charging by using a small current (such as 5 A). A charging time may be a time corresponding to obtaining of an SOC of the battery in a balance state after a battery cell is offline (this is related to a temperature).

F: Keyon or Different charging manners—others

Abandon the capacity learning of this time, eliminate related variables, and wait for a next time of learning.

G: Obtaining a second SOC

No matter in whichever case, once the offline time of the battery pack exceeds a minimum time for obtaining a valid OCV after the battery pack is offline, and there is no charging current, the second SOC may be obtained in a relatively accurate manner.

G_1: A cell offline time allows direct obtaining of the SOC from a port voltage.

This is a known method. Usually, a group of port voltage values are read, an RMS value is obtained, and an SOC value is deduced according to a cell temperature.

G_2: KeyON/charging waking is performed, and an offline time allows estimation of a final SOC value.

A specific process is that:

Step 1: Determine a Keyoff time before the KeyOn/charging event and that the Keyoff time is long enough for the estimation process (longer than the second threshold above). Predefine a sampling period $T_s$ and a number of samples (M) of battery voltage for estimating the SOC. As such, M samples of voltage preceding the Keyon/charging event are used for the estimation. The earliest voltage sample used for the estimation, accordingly, is a sample taken at $M*T_s$ preceding the Keyon/charging event. Here $M*T_s$ would necessarily be shorter than the second threshold above. During the time between the Keyoff and the first voltage sample to be used for the estimation, N voltage samples are taken but are not used for the estimation. As such, the total Keyoff period is $(N+M)*T_s$. Among the total of N+M samples, only the later M samples are used for the estimation. These M samples are represented by: V(i, 1), V(i, 2), ..., V(i, M)

Step 2: List equations according the battery model of FIG. 2:

$$V(i,1) = OCV - e^{-(N+1)*Ts/(R_1*C_1)} * V_{rc1}(0) - e^{-(N+1)*Ts/(R_2*C_2)} * V_{rc2}(0)$$

...

$$V(i,M) = OCV - e^{-(N+M)*Ts/(R_1*C_1)} * V_{rc1}(0) - e^{-(N+M)*Ts/(R_2*C_2)} * V_{rc2}(0)$$

Step 3: Obtain an OCV by using a least square method:

$$\begin{bmatrix} V(i,1) \\ V(i,2) \\ \cdots \\ V(i,M) \end{bmatrix} = \begin{bmatrix} 1 & -e^{-(N+1)*Ts/(R_1*C_1)} & -e^{-(N+1)*Ts/(R_2*C_2)} \\ 1 & -e^{-(N+2)*Ts/(R_1*C_1)} & -e^{-(N+2)*Ts/(R_2*C_2)} \\ \cdots & & \\ 1 & -e^{-(N+M)*Ts/(R_1*C_1)} & -e^{-(N+M)*Ts/(R_2*C_2)} \end{bmatrix} * \begin{bmatrix} OCV \\ V_{rc1}(0) \\ V_{rc2}(0) \end{bmatrix}$$

The OCV may be obtained by using the least square method. This is an OCV value that needs to be estimated. An SOC value may be obtained by using the OCV and a temperature (assuming that the temperature is consistent with a current readout).

Step 4: If further accuracy is needed, perform the foregoing steps to repeat calculation, and average an obtained OCV projection.

G_3: KeyOn waking or another charging waking is performed, and an offline time does not allow estimation of the final SOC value; as stated above, stop learning of this time and wait for a next time of learning.

G_4: Waking of a household slow charger is performed, and an offline time does not allow estimation of the final SOC value; a low current $I_{small}$ is used to charge for a period of time so as to obtain SOC2; because the current $I_{small}$ is very low and the charging time is not long, an error caused by calculating this small SOC change by using a past capacity may be ignored (substep 44) above). Furthermore, such deficiency can be remediated by using battery electric model parameters, that is, The third OCV value according to step 442) above, can be further modified if direct current resistance of the battery can be obtained at the present battery temperature. That is, $$OCV_3 = V_3 - I_{small} * (r_0 + r_1 + r_2)$$

where $V_3$ is the battery voltage as measured in 441), $I_{small}$ is the charge current flowing into the battery, and $r_0$, $r_1$ and $r_2$ are resistances of the equivalent battery model at present battery temperature, as shown in FIG. 2.

H: Calculating the capacity

Once the first SOC and the second SOC are determined, and the current integral is obtained, the capacity $Q_{learned}$ may be obtained by means of definition (Step 5) above).

I: Capacity filtering

During development of the BMS, a filtering coefficient is determined. The coefficient is adjusted along with each capacity learning interval:

Calculation of the filtering coefficient:

It is considered that a calibrated capacity learning time is T1, an actual interval is Tc, and an actual lift clock of the battery pack is T; therefore, a filtering coefficient that is actually used is:

$$Alpha_{new} = Alpha \times \frac{\sqrt{T + T_1}}{\sqrt{T + T_c}}$$

Note: The meaning of a square root of use time is that a research indicates that attenuation of a battery capacity on time is inversely proportional to a time square root. Here, $Alpha_{new} \leq 1$ (if $Alpha_{new}$ is greater than 1, $Alpha_{new}$ is set to 1); Alpha is a calibrated value that may be predefined using empirical approaches, e.g., 0.95.

Capacity calculation:

$$Q = Q_{old} \times Alpha_{new} + (1 - Alpha_{new}) \times Q_{learned}$$

Data storage:

Once learning is ended, the BMS stores the capacity and the learning time (which is updated to a current global clock) into an EEPROM.

As such, the disclosure above provides a method for estimating capacity of a battery in an electric vehicle under non-equilibrium conditions. In particular, two SOCs at two time points are used together with the integrated amount of charge/discharge between the two time points to learn the capacity. The learned capacity is further filtered and corrected based on empirical information. The first SOC may be directly obtained at equilibrium or near-equilibrium by, e.g., measuring OCV of the battery after sufficiently long offline time (of no charging or discharging) for the battery (the first threshold above). After obtaining the first SOC, the vehicle goes through a Keyon and Keyoff cycle (vehicle operation). The battery charges and discharges during the vehicle operation. After the Keyoff and at the next Keyon or charging event (wakeup event), a determination is made as to how to estimate the second SOC at the time of the wakeup event. The determination depends on the time lapse (t) between the Keyoff and the wakeup event. If t is longer than the first predetermined threshold and thus suggests that the battery has sufficient offline time to reach equilibrium, then the second SOC may be directly obtained by using the OCV recorded at the time of the wakeup event, just like the first SOC. If t is shorter than the first predetermined threshold but longer than a second predetermined threshold, then the second SOC at the time of the wakeup event may be estimated by taking voltage samples proceeding the wakeup event to establish a set of relationships between a OCV at the time of the wakeup event (to be calculated, cannot be accurately measured because the battery is not in equilibrium) and the samples based on a battery circuit model, and solving for the true OCV at the time of the wakeup event using a least square method. The second SOC at the time of the wakeup event may then be directly obtained from the solved true OCV. If the wakeup event is a slow charging event, then after a slow charging that is longer than the first threshold, it may be considered that the battery is in a stable state and the OCV at the stable state may be measured or calculated and used to backtrack the OCV at the time of the wakeup event considering the integrated amount of slow charging. The backtracked OCV at the time of the wakeup event may then be used to derive the second SOC at the time of the wakeup event. As such, when t is shorter than the second threshold, the charge capacity may still be estimated if the wakeup event is slow charging and the slow charging has become stable. If t is longer than the second threshold but smaller than the first threshold and the wakeup event is Keyon, then the charge capacity can be estimated using the least square method. If t is longer than the second threshold but shorter than the first threshold and the wakeup event is slow charging, then the charge capacity can be estimated using either the least square method or backtracking method above.

The implementations above are only examples of the principles underlying this disclosure. Other implementations based on these general principles are also within the protective scope of this disclosure.

What is claimed is:

1. A battery management system arranged in an electric vehicle having a battery, the battery management system configured to:
   1) determine that a battery capacity periodic estimation time of the battery is reached, and in response to determining that the battery capacity periodic estimation time of the battery is reached, proceed to step 2);
   2) determine that a first SOC (State Of Charge) value of a battery can be accurately obtained, and in response to determining that the first SOC value of the battery can be accurately obtained, obtain the first SOC value by reading a first OCV (Open Circuit Voltage) value and a current temperature of the battery, and proceed to step 3);

3) calculate a total discharging and charging current integral value of the battery in an operating state of the electric vehicle following obtaining the first SOC value;

4) determine that a battery offline time since the end of the operating state of the electric vehicle and before the next Keyon or charging event reaches a first threshold, and in response to that the battery offline time reaches the first threshold, directly read a port voltage of the battery and a battery cell temperature, and obtain a second SOC value based on the port voltage and the battery cell temperature, and proceed to step 5);

5) calculate a battery capacity estimation value of the battery based on the first SOC value obtained in step 2), the total current integral value obtained in step 3), and the second SOC value obtained in step 4); and wherein the first threshold is a predetermined period of time representing a time needed by the battery to reach equilibrium.

2. A battery management system arranged in an electric vehicle having a battery, the battery management system configured to:

1) determine that a battery capacity periodic estimation time of the battery is reached, and in response to determining that the battery capacity periodic estimation time of the battery is reached, proceed to step 2);

2) determine that a first SOC (State Of Charge) value of a battery can be accurately obtained, and in response to determining that the first SOC value of the battery can be accurately obtained, obtain the first SOC value by reading a first OCV (Open Circuit Voltage) value and a current temperature of the battery, and proceed to step 3);

3) calculate a total discharging and charging current integral value of the battery in an operating state of the electric vehicle following obtaining the first SOC value;

4) determine that the battery offline time since the end of the operating state of the electric vehicle and before the next Keyon or charging event reaches a second threshold and that the electric vehicle enters the non-offline state via the next Keyon event, and in response to that the battery offline time reaches the second threshold and the electric vehicle enters the non-offline state via the next Keyon event, obtain the second SOC value by performing estimation calculation, estimated, estimating the second SOC value and proceed to step 5);

5) calculate a battery capacity estimation value of the battery based on the first SOC value obtained in step 2), the total current integral value obtained in step 3), and the second SOC value obtained in step 4).

3. The battery management system according to claim 2, wherein the system is configured to obtain the second SOC value by:

41) reading a battery offline time, a battery voltage at a time of the Keyon or charging event, and battery voltages proceeding the Keyon or charging event;

42) obtaining relational expressions, based on a battery model, of a second OCV value of the battery at the time of the Keyon event, the battery voltage at the time of the Keyon event, and the battery voltages preceeding the Keyon or charging event, and the battery offline time;

43) solving the relational expressions in step 42) by using a least square method, to obtain the second OCV value of the battery at the time of the Keyon event; and 44) obtaining the second SOC value of the battery according to the second OCV value of the battery and a current battery temperature.

4. The battery management system according to claim 3, wherein obtaining the second SOC value by performing estimation calculation further comprises: before step 44), repeating steps 41) to step 43), to obtain a number of second OCV values for the battery; calculating an average value of the number of second OCV values of the battery; and using the average value as a final result for the second OCV value.

5. A battery management system arranged in an electric vehicle having a battery, the battery management system configured to:

1) determine that a battery capacity periodic estimation time of the battery is reached, and in response to determining that the battery capacity periodic estimation time of the battery is reached, proceed to step 2);

2) determine that a first SOC (State Of Charge) value of a battery can be accurately obtained, and in response to determining that the first SOC value of the battery can be accurately obtained, obtain the first SOC value by reading a first OCV (Open Circuit Voltage) value and a current temperature of the battery, and proceed to step 3);

3) calculate a total discharging and charging current integral value of the battery in an operating state of the electric vehicle following obtaining the first SOC value;

4) determine, according to a battery offline time since an end of the operating state of the electric vehicle and before the electric vehicle enters a non-offline state via a next Keyon or charging event, that a second SOC value of the battery at a time of the next Keyon or charging event can be estimated, and in response to determining that the second SOC value of the battery can be estimated, estimate the second SOC value and proceed to step 5); and 5) calculate a battery capacity estimation value of the battery based on the first SOC value obtained in step 2), the total current integral value obtained in step 3), and the second SOC value obtained in step 4); and wherein step 4) of the system is further configured to:

41) determine that the battery offline time since the end of the operating state of the electric vehicle and before the next Keyon or charging event does not reach a second threshold and that the electric vehicle enters the non-offline state via a slow charging event, and in response to such determination and further in response to a slow charging time of the slow charging event reaching a first threshold, calculate by means of low current charging to obtain the second SOC value at a time the electric vehicle enters the slow charging event.

6. The battery management system according to claim 5, wherein to calculate by means of low current charging to obtain the second SOC value at a time the electric vehicle enters the slow charging event of step 41) comprises:

411) read a current battery voltage and a current battery temperature following the slow charging time;

412) obtain, according to the current battery voltage and the current battery temperature, a third OCV value of the battery;

413) obtain, according to a SOC-OCV relation curve of the battery for the current temperature, a third SOC value corresponding to the third OCV value; and 414) calculate according to the third OCV value and a current value for the slow charging, to obtain the second SOC value, by following:

$$SOC_2 = SOC_3 - \frac{I_{small} \times T_{cal1} \times \eta}{Q_{old}},$$

wherein
$SOC_2$ is the second SOC value, is $SOC_3$ is the third SOC value, $I_{small}$ is the current value of the slow charging, $T_{cal1}$ is the slow charging time, $\eta$ is a battery charging and discharging efficiency, and $Q_{old}$ is a historical estimation result for the battery capacity.

7. The battery management system according to claim 6, wherein to obtain the third OCV value of the battery comprises:
   obtain the current battery voltage;
   obtain a set of battery parameters based on an equivalent circuit model for the battery at the current battery temperature; and
   obtain the third OCV value of the battery based on the current battery voltage, the set of battery parameters, and the current value for the slow charging.

8. The battery management system according to claim 7, wherein to obtain the third OCV value of the battery based on the current battery voltage, the set of battery parameters, and the current value for the slow charging comprises:
   Calculate to obtain the third OCV value of the battery following:

$$OCV_3 = V_3 + I_{small} * (r_0 + r_1 + r_2),$$

where $V_3$ is the current battery voltage as measured, $I_{small}$ is the current value for the slow charging, and $r_0$, $r_1$ and $r_2$ are resistances of the equivalent circuitry model for the battery at the current battery temperature.

9. The battery management system according to claim 5, wherein the first threshold is predetermined period of time representing a time need by the battery to reach equilibrium.

10. A battery management system arranged in an electric vehicle having a battery, the battery management system configured to:
   1) determine that a battery capacity periodic estimation time of the battery is reached, and in response to determining that the battery capacity periodic estimation time of the battery is reached, proceed to step 2);
   2) determine that a first SOC (State Of Charge) value of a battery can be accurately obtained, and in response to determining that the first SOC value of the battery can be accurately obtained, obtain the first SOC value by reading a first OCV (Open Circuit Voltage) value and a current temperature of the battery, and proceed to step 3);
   3) calculate a total discharging and charging current integral value of the battery in an operating state of the electric vehicle following obtaining the first SOC value;
   4) determine, according to a battery offline time since an end of the operating state of the electric vehicle and before the electric vehicle enters a non-offline state via a next Keyon or charging event, that a second SOC value of the battery at a time of the next Keyon or charging event can be estimated, and in response to determining that the second SOC value of the battery can be estimated, estimate the second SOC value and proceed to step 5); and
   5) calculate a battery capacity estimation value of the battery based on the first SOC value obtained in step 2), the total current integral value obtained in step 3), and the second SOC value obtained in step 4); and
   wherein step 5) the system is configured to:
   51) calculate according to the first SOC value obtained in step 2), the total current integral value obtained in step 3), and the second SOC value obtained in step 4) to obtain a learned current capacity $Q_{learned}$;
   52) calculate, according to an estimation time of the battery, a current capacity filtering coefficient $Alpha_{new}$; and
   53) calculate, according to the learned current capacity $Q_{learned}$ obtained in step 51) and the current capacity filtering coefficient $Alpha_{new}$ obtained in step 52), to obtain the battery capacity estimation value of the battery of the electric vehicle.

11. The battery management system according to claim 10, wherein the current capacity filtering coefficient $Alpha_{new}$ is calculated in 52) following:

$$Alpha_{new} = Alpha \times \frac{\sqrt{T+T_1}}{\sqrt{T+T_c}},$$

wherein
   Alpha is a calibrated filtering coefficient, T is a battery actual lifespan clock at a previously scheduled capacity estimation time, $T_1$ is a current scheduled capacity estimation time of the battery, and $T_c$ is an actual current capacity estimation time of the battery.

12. The battery management system according to claim 10, wherein the battery capacity estimation value of the battery electric vehicle is calculated in 53) following:

$Q = Q_{old} \times Alpha_{new} + (1 - Alpha_{new}) \times Q_{learned}$, where $Q_{old}$ is a previous estimation result for the battery capacity and Q is the battery capacity estimation value.

* * * * *